United States Patent
Otoshi et al.

(10) Patent No.: US 8,198,539 B2
(45) Date of Patent: Jun. 12, 2012

(54) HEAT RADIATOR AND POWER MODULE

(75) Inventors: Kota Otoshi, Kariya (JP); Eiji Kono, Kariya (JP); Keiji Toh, Kariya (JP); Katsufumi Tanaka, Kariya (JP); Yuichi Furukawa, Oyama (JP); Shinobu Yamauchi, Oyama (JP); Ryoichi Hoshino, Oyama (JP); Nobuhiro Wakabayashi, Oyama (JP); Shintaro Nakagawa, Oyama (JP)

(73) Assignees: Kabushiki Kaisha Toyota Jidoshokki, Kariya-shi (JP); Showa Denko K.K., Tokyo (JP)

( * ) Notice: Subject to any disclaimer, the term of this patent is extended or adjusted under 35 U.S.C. 154(b) by 502 days.

(21) Appl. No.: 11/994,896

(22) PCT Filed: Jul. 5, 2006

(86) PCT No.: PCT/JP2006/313376
§ 371 (c)(1),
(2), (4) Date: Jun. 12, 2008

(87) PCT Pub. No.: WO2007/007602
PCT Pub. Date: Jan. 18, 2007

(65) Prior Publication Data
US 2009/0200065 A1    Aug. 13, 2009

(30) Foreign Application Priority Data
Jul. 7, 2005   (JP) .................... 2005-198288

(51) Int. Cl.
*H05K 1/00*   (2006.01)
(52) U.S. Cl. ........ 174/252; 174/262; 361/696; 361/697; 361/698; 361/704; 361/709; 361/719; 361/720; 165/70; 165/80.3; 165/104.33; 165/185

(58) Field of Classification Search ............... 174/252, 174/262; 361/704, 720, 696–698, 709, 719; 165/80.3, 80.4, 102, 144, 170, 186, 70, 104.33, 165/185; 428/614; 438/122, 408; 257/98, 257/100, 530, 675, 702, 705, 707, 787
See application file for complete search history.

(56) References Cited

U.S. PATENT DOCUMENTS
4,069,498 A   1/1978   Joshi
(Continued)

FOREIGN PATENT DOCUMENTS
EP   0 046 605 A2   3/1982
(Continued)

*Primary Examiner* — Xiaoliang Chen
(74) *Attorney, Agent, or Firm* — Oblon, Spivak, McClelland, Maier & Neustadt, L.L.P.

(57) ABSTRACT

A heat radiator 1 includes an insulating substrate 3 whose first side serves as a heat-generating-element-mounting side, and a heat sink 5 fixed to a second side of the insulating substrate 3. A metal layer 7 is formed on the second side of the insulating substrate 3 opposite the heat-generating-element-mounting side. A stress relaxation member 4 formed of a high-thermal-conduction material intervenes between the metal layer 7 of the insulating substrate 3 and the heat sink 5 and includes a plate-like body 10 and a plurality of projections 11 formed at intervals on one side of the plate-like body 10. The end faces of the projections 11 of the stress relaxation member 4 are brazed to the metal layer 7, whereas the side of the plate-like body 10 on which the projections 11 are not formed is brazed to the heat sink 5. This heat radiator 1 is low in material cost and exhibits excellent heat radiation performance.

19 Claims, 4 Drawing Sheets

U.S. PATENT DOCUMENTS

| | | | | |
|---|---|---|---|---|
| 5,111,278 | A * | 5/1992 | Eichelberger | 257/698 |
| 5,442,143 | A * | 8/1995 | Schmidt et al. | 174/262 |
| 5,510,650 | A | 4/1996 | Erskine, Jr. | |
| 5,678,287 | A * | 10/1997 | Smith et al. | 438/613 |
| 5,691,209 | A * | 11/1997 | Liberkowski | 438/10 |
| 5,707,756 | A * | 1/1998 | Inoue et al. | 429/57 |
| 5,737,187 | A * | 4/1998 | Nguyen et al. | 361/704 |
| 5,930,115 | A * | 7/1999 | Tracy et al. | 361/704 |
| 5,981,085 | A * | 11/1999 | Ninomiya et al. | 428/614 |
| 6,058,012 | A * | 5/2000 | Cooper et al. | 361/704 |
| 6,064,216 | A * | 5/2000 | Farnworth et al. | 324/755 |
| 6,166,904 | A * | 12/2000 | Kitahara et al. | 361/697 |
| 6,239,972 | B1 * | 5/2001 | Tehan et al. | 361/704 |
| 6,245,442 | B1 * | 6/2001 | Towata et al. | 428/614 |
| 6,297,961 | B1 * | 10/2001 | Koizumi et al. | 361/720 |
| 6,374,490 | B1 * | 4/2002 | Miyahara | 29/890.03 |
| 6,399,422 | B1 * | 6/2002 | Tomita et al. | 438/122 |
| 6,704,249 | B2 * | 3/2004 | Yoshikawa et al. | 369/13.23 |
| 6,896,039 | B2 * | 5/2005 | Dussinger et al. | 165/104.26 |
| 6,956,757 | B2 * | 10/2005 | Shepard | 365/100 |
| 6,994,151 | B2 * | 2/2006 | Zhou et al. | 165/80.4 |
| 7,000,684 | B2 * | 2/2006 | Kenny et al. | 165/80.4 |
| 7,104,312 | B2 * | 9/2006 | Goodson et al. | 165/80.4 |
| 7,215,549 | B2 * | 5/2007 | Kim | 361/704 |
| 7,396,735 | B2 * | 7/2008 | Nakanishi et al. | 438/408 |
| 7,584,780 | B1 * | 9/2009 | Lemont et al. | 165/80.3 |
| 2002/0197840 | A1 * | 12/2002 | McKee | 438/597 |
| 2003/0189830 | A1 * | 10/2003 | Sugimoto et al. | 362/294 |
| 2003/0221718 | A1 * | 12/2003 | Kubo et al. | 136/256 |
| 2004/0194933 | A1 * | 10/2004 | Ikeda | 165/144 |
| 2005/0194371 | A1 * | 9/2005 | Weinfield et al. | 219/428 |
| 2005/0229696 | A1 * | 10/2005 | Takayama | 73/204.26 |
| 2006/0108906 | A1 * | 5/2006 | Gosain et al. | 313/309 |
| 2006/0113661 | A1 * | 6/2006 | Yamabuchi et al. | 257/706 |
| 2006/0197181 | A1 * | 9/2006 | Noguchi | 257/530 |
| 2006/0226773 | A1 * | 10/2006 | Kim et al. | 313/512 |
| 2007/0000655 | A1 * | 1/2007 | Uchida et al. | 165/170 |
| 2007/0077349 | A1 * | 4/2007 | Newman et al. | 427/66 |
| 2007/0132110 | A1 * | 6/2007 | Fujita et al. | 257/787 |
| 2008/0210405 | A1 * | 9/2008 | Datta et al. | 165/102 |

FOREIGN PATENT DOCUMENTS

| | | |
|---|---|---|
| EP | 0 046 605 A3 | 3/1982 |
| EP | 1 450 402 A1 | 8/2004 |
| JP | 2 102565 | 4/1990 |
| JP | 3 253063 | 11/1991 |
| JP | 4 71256 | 3/1992 |
| JP | 4 123441 | 4/1992 |
| JP | 2000 82887 | 3/2000 |
| JP | 2004 87612 | 3/2004 |
| JP | 2004-153075 | 5/2004 |
| WO | WO 98/20549 | 5/1998 |

* cited by examiner

HEAT RADIATOR AND POWER MODULE

TECHNICAL FIELD

The present invention relates to a heat radiator, and more particularly to a heat radiator which includes an insulating substrate whose first side serves as a heat-generating-element-mounting side, and a heat sink fixed to a second side of the insulating substrate and which radiates, from the heat sink, heat generated from a heat-generating member, such as a semiconductor device, mounted on the insulating substrate.

The term "aluminum" as used herein and in the appended claims encompasses aluminum alloys in addition to pure aluminum, except for the case where "pure aluminum" is specified.

BACKGROUND ART

In a power module which uses a semiconductor device, such as an IGBT (Insulated Gate Bipolar Transistor), the semiconductor device must be held at a predetermined temperature or lower by means of efficiently radiating heat generated therefrom. Conventionally, in order to meet the requirement, a heat radiator is used. The heat radiator includes an insulating substrate which is formed of a ceramic, such as aluminum oxide ($Al_2O_3$) or aluminum nitride (AlN), and whose first side serves as a heat-generating-element-mounting side, and a heat sink which is formed of a high-thermal-conduction metal, such as aluminum or copper (including copper alloys; hereinafter, the same is applied), and is soldered to a second side of the insulating substrate. A semiconductor device is soldered to the heat-generating-element-mounting side of the insulating substrate of the heat radiator, thereby forming the power module.

A power module used in, for example, a hybrid car must maintain the heat radiation performance of a heat radiator over a long term. The above-mentioned conventional heat radiator involves the following problem. Under some working conditions, thermal stress arises from a difference in coefficient of linear thermal expansion between the insulating substrate and the heat sink and causes cracking in the insulating substrate, cracking in a solder layer which bonds the insulating substrate and the heat sink together, or warpage of a bond surface of the heat sink bonded to the insulating substrate. Such cracking or warpage impairs heat radiation performance.

A proposed heat radiator in which the above problem is solved includes an insulating substrate whose first side serves as a heat-generating-element-mounting side, a heat radiation member which is soldered to a second side of the insulating substrate, and a heat sink which is screwed on the heat radiation member. The heat radiation member includes a pair of platelike heat-radiation-member bodies formed of a high-thermal-conduction material, such as aluminum or copper, and a low-thermal-expansion material, such as an Invar alloy, intervening between the platelike heat-radiation-member bodies. (Refer to Patent Document 1).

However, the heat radiator described in Patent Document 1 must use the heat radiation member formed of a high-thermal-conduction material and a low-thermal-expansion material; thus, material cost is increased. Furthermore, since the heat radiation member and the heat sink are merely screwed together, thermal conduction therebetween is insufficient, resulting in a failure to provide sufficient heat radiation performance.

Patent Document 1: Japanese Patent Application Laid-Open (kokai) No. 2004-153075

DISCLOSURE OF THE INVENTION

Problems to be Solved by the Invention

An object of the present invention is to solve the above problem and to provide a heat radiator whose material cost is low and which exhibits excellent heat radiation performance.

Means for Solving the Problems

To achieve the above object, the present invention comprises the following modes.

1) A heat radiator comprising an insulating substrate whose first side serves as a heat-generating-element-mounting side, and a heat sink fixed to a second side of the insulating substrate;

wherein a stress relaxation member formed of a high-thermal-conduction material intervenes between the insulating substrate and the heat sink and comprises a plate-like body and a plurality of projections formed at intervals on at least one side of the plate-like body, and the stress relaxation member is metal-bonded to the insulating substrate and to the heat sink.

2) A heat radiator according to par. 1), wherein the plurality of projections are formed on only one side of the plate-like body of the stress relaxation member, and either a side of the plate-like body of the stress relaxation member on which the projections are not formed or end faces of the projections are metal-bonded to the insulating substrate, whereas the side of the plate-like body of the stress relaxation member on which the projections are not formed or the end faces of the projections, whichever are not metal-bonded to the insulating substrate, are metal-bonded to the heat sink.

3) A heat radiator according to par. 2), wherein a thermal-conduction plate formed of a high-thermal-conduction material and having through-holes allowing the respective projections of the stress relaxation member to extend therethrough overlies the side of the plate-like body of the stress relaxation member on which the projections are formed, and the thermal-conduction plate is metal-bonded to the insulating substrate or the heat sink, whichever is metal-bonded to the end faces of the projections.

4) A heat radiator according to par. 1), wherein two stress relaxation members each having the plurality of projections on only one side of the plate-like body are disposed between the insulating substrate and the heat sink; a side of the plate-like body of one stress relaxation member on which the projections are not formed is metal-bonded to the insulating substrate, whereas a side of the plate-like body of the other stress relaxation member on which the projections are not formed is metal-bonded to the heat sink; and the projections of one stress relaxation member are positioned in respective gaps between the projections of the other stress relaxation member, and the end faces of the projections of one stress relaxation member are metal-bonded to the plate-like body of the other stress relaxation member, and vice versa.

5) A heat radiator according to par. 1), wherein the projections are solid, columnar portions formed integrally with the plate-like body.

6) A heat radiator according to par. 1), wherein the projections are hollow tubular portions formed integrally with the plate-like body around respective through-holes formed in the plate-like body.

7) A heat radiator according to par. 1), wherein each of the projections has a cross section having a circular outline, and a projecting height of each of the projections is greater than a diameter of the cross section.

8) A heat radiator according to par. 7), wherein the diameter of the cross section of each of the projections is 0.8 mm or greater and less than 1.5 mm, and the projecting height is in excess of 0.8 mm and not greater than 1.5 mm.

9) A heat radiator according to par. 1), wherein each of the projections has a cross section having a circular outline, and a projecting height of each of the projections is smaller than a diameter of the cross section.

10) A heat radiator according to par. 9), wherein the diameter of the cross section of each of the projections is 1.5 mm to 3 mm, and the projecting height is 0.5 mm to 0.8 mm.

11) A heat radiator according to par. 1), wherein gaps between the projections of the stress relaxation member are filled with high-thermal-conduction grease or a thermal-conduction resin.

12) A heat radiator according to par. 1), wherein the insulating substrate has a metal layer formed on the second side opposite the heat-generating-element-mounting side, and the stress relaxation member is metal-bonded to the metal layer.

13) A heat radiator according to par. 1), wherein the high-thermal-conduction material is aluminum.

14) A heat radiator according to par. 1), wherein metal-bonding is brazing.

15) A power module comprising a heat radiator according to any one of pars. 1) to 14), and a semiconductor device mounted on the heat-generating-element-mounting side of the insulating substrate of the heat radiator.

Effects of the Invention

According to the heat radiator of par. 1), the stress relaxation member formed of a high-thermal-conduction material intervenes between the insulating substrate and the heat sink and comprises a plate-like body and a plurality of projections formed at intervals on at least one side of the plate-like body, and the stress relaxation member is metal-bonded to the insulating substrate and to the heat sink. Thus, excellent thermal conductivity is established between the insulating substrate and the heat sink, thereby improving heat radiation performance for radiating heat generated by a semiconductor device mounted on the heat-generating-element-mounting side of the insulating substrate. Furthermore, even when thermal stress arises in the heat radiator from a difference in coefficient of linear thermal expansion between the insulating substrate and the heat sink, the projections of the stress relaxation member are deformed, thereby relaxing the thermal stress and thus preventing cracking in the insulating substrate, cracking in a bond zone between the insulating substrate and the stress relaxation member, and warpage of the surface of the heat sink located on a side toward the insulating substrate. Accordingly, heat radiation performance is maintained over a long term. Also, since the stress relaxation member comprises the plate-like body and the plurality of projections formed at intervals on at least one side of the plate-like body, cost of the stress relaxation member becomes relatively low, thereby lowering material cost for the heat radiator.

According to the heat radiator of par. 2), the plurality of projections are formed on only one side of the plate-like body of the stress relaxation member, and either a side of the plate-like body of the stress relaxation member on which the projections are not formed or end faces of the projections are metal-bonded to the insulating substrate, whereas the side of the plate-like body of the stress relaxation member on which the projections are not formed or the end faces of the projections, whichever are not metal-bonded to the insulating substrate, is metal-bonded to the heat sink. Thus, excellent thermal conductivity is established between the insulating substrate and the heat sink, thereby improving heat radiation performance for radiating heat generated by a semiconductor device mounted on the heat-generating-element-mounting side of the insulating substrate. Furthermore, even when thermal stress arises in the heat radiator from a difference in coefficient of linear thermal expansion between the insulating substrate and the heat sink, the projections of the stress relaxation member are deformed, thereby relaxing the thermal stress and thus preventing cracking in the insulating substrate, cracking in a bond zone between the insulating substrate and the stress relaxation member, and warpage of the surface of the heat sink located on a side toward the insulating substrate. Accordingly, heat radiation performance is maintained over a long term. Also, since the stress relaxation member comprises the plate-like body and the plurality of projections formed on only one side of the plate-like body, cost of the stress relaxation member becomes relatively low, thereby lowering material cost for the heat radiator.

According to the heat radiator of par. 3), since employment of the thermal-conduction plate increases the area of heat transfer between the insulating substrate and heat sink, thermal conductivity between the insulating substrate and the heat sink is further enhanced, thereby improving heat radiation performance for radiating heat generated by a semiconductor device mounted on the heat-generating-element-mounting side of the insulating substrate. Furthermore, even when thermal stress arises in the heat radiator from a difference in coefficient of linear thermal expansion between the insulating substrate and the heat sink, by virtue of the through-holes, the thermal-conduction plate is deformed, thereby relaxing the thermal stress.

According to the heat radiator of par. 4), since employment of the two stress relaxation members increases the area of heat transfer between the insulating substrate and heat sink, thermal conductivity between the insulating substrate and the heat sink is further enhanced, thereby improving heat radiation performance for radiating heat generated by a semiconductor device mounted on the heat-generating-element-mounting side of the insulating substrate. Furthermore, even when thermal stress arises in the heat radiator from a difference in coefficient of linear thermal expansion between the insulating substrate and the heat sink, the projections of the two stress relaxation members are deformed, thereby relaxing the thermal stress and thus preventing cracking in the insulating substrate, cracking in a bond zone between the insulating substrate and the stress relaxation member, and warpage of the surface of the heat sink located on a side toward the insulating substrate.

According to the heat radiator of par. 7) or 8), when thermal stress arises in the heat radiator, the degree of deformation of the projections is large. Thus, even when relatively high thermal stress arises in the heat radiator, the thermal stress can be relaxed.

In the case of the heat radiator of par. 9) or 10), when thermal stress arises in the heat radiator, the degree of deformation of the projections is small. However, in the case where thermal stress arising in the heat radiator is relatively low, the thermal stress can be sufficiently relaxed.

According to the heat radiator of par. 11), high-thermal-conduction grease or a thermal-conduction resin which fills the gaps between the projections of the stress relaxation member further enhances thermal conductivity between the insulating substrate and the heat sink, thereby improving heat radiation performance for radiating heat generated by a semiconductor device mounted on the heat-generating-element-mounting side of the insulating substrate.

According to the heat radiator of par. 14), the stress relaxation member is brazed to the insulating substrate and to the heat sink. Thus, bonding of the stress relaxation member and the insulating substrate and bonding of the stress relaxation member and the heat sink can be performed simultaneously, thereby improving workability in fabrication of the heat radiator. According to the heat radiator described in Patent Document 1, after the insulating substrate and the heat radiation member are soldered together, the heat radiation member and the heat sink must be screwed together; therefore, workability in fabrication of the heat radiator is poor.

BEST MODE FOR CARRYING OUT THE INVENTION

Embodiments of the present invention will next be described with reference to the drawings. In the following description, the upper, lower, left-hand, and right-hand sides of FIGS. 1, 3, and 5 will be referred to as "upper," "lower," "left," and "right," respectively. In all the drawings, like features or parts are denoted by like reference numerals, and repeated description thereof is omitted.

Embodiment 1

The present embodiment is shown in FIGS. 1 and 2.

FIG. 1 shows a portion of a power module which uses a heat radiator of Embodiment 1. FIG. 2 shows a stress relaxation member of the heat radiator of Embodiment 1.

In FIG. 1, the power module includes a heat radiator 1 and a semiconductor device 2; for example, an IGBT, mounted on the heat radiator 1.

The heat radiator 1 includes an insulating substrate 3 whose upper surface serves as a heat-generating-element-mounting side; a stress relaxation member 4 bonded to the lower surface of the insulating substrate 3; and a heat sink 5 bonded to the lower surface of the stress relaxation member 4.

The insulating substrate 3 may be formed of any insulating material, so long as it satisfies requirements for insulating characteristics, thermal conductivity, and mechanical strength. For example, when a ceramic is used to form the insulating substrate 3, aluminum oxide or aluminum nitride is used. A circuit layer 6 is formed on the upper surface; i.e., the heat-generating-element-mounting side, of the insulating substrate 3, and the semiconductor device 2 is bonded onto the circuit layer 6. This bonding is performed by, for example, soldering. The solder layer is not shown. The circuit layer 6 is formed of a metal having excellent electrical conductivity, such as aluminum or copper. Preferably, the circuit layer 6 is formed of a pure aluminum having high purity, which exhibits high electrical conductivity, high deformability, and excellent solderability in relation to a semiconductor device. A metal layer 7 is formed on the lower surface of the insulating substrate 3. The stress relaxation member 4 is brazed to the metal layer 7. The brazing-material layer is not shown. The metal layer 7 is formed of a metal having excellent thermal conductivity, such as aluminum or copper. Preferably, the metal layer 7 is formed of a pure aluminum having high purity, which exhibits high thermal conductivity, high deformability, and excellent wettability in relation to a molten brazing material. The insulating substrate 3, the circuit layer 6, and the metal layer 7 constitute a power module substrate 8.

As shown in FIG. 2, the stress relaxation member 4 is formed of a high-thermal-conduction material; herein, aluminum, by, for example, cold-forging. The stress relaxation member 4 includes a plate-like body 10 and a plurality of solid, circular, columnar projections 11 which are formed at intervals in a staggered arrangement on the upper surface of the plate-like body 10. The end faces of the projections 11 are brazed to the metal layer 7, and the lower surface of the plate-like body 10 is brazed to the heat sink 5. Preferably, the stress relaxation member 4 is formed of a pure aluminum having a purity of 99% or higher, desirably 99.5% or higher, which exhibits high thermal conductivity, high deformability induced by a drop in strength caused by brazing heat, and excellent wettability in relation to a molten brazing material.

Preferably, the thickness of the plate-like body 10 is 0.5 mm to 3 mm. If the plate-like body 10 is excessively thin, at the time of generation of thermal stress in the heat radiator 1 due to a difference in coefficient of thermal expansion between the insulating substrate 3 and the heat sink 5, the deformation of the stress relaxation member 4 becomes insufficient; consequently, the stress relaxation member 4 may fail to sufficiently exhibit stress relaxation performance. If the plate-like body 10 is excessively thick, thermal conductivity drops; consequently, heat radiation performance may drop.

In the case where thermal stress arising in the heat radiator 1 is relatively high, preferably, each of the projections 11 has a projecting height greater than the diameter of its cross section. More preferably, the projecting height of each projection 11 is in excess of 0.8 mm and not greater than 1.5 mm, and the diameter of the cross section of each projection 11 is 0.8 mm or greater and less than 1.5 mm. If the projecting height of each projection 11 is excessively low, and the diameter of the cross section of each projection 11 is excessively large, at the time of generation of thermal stress in the heat radiator 1 due to a difference in coefficient of thermal expansion between the insulating substrate 3 and the heat sink 5, the deformation of the stress relaxation member 4 becomes insufficient; consequently, the stress relaxation member 4 may fail to sufficiently exhibit stress relaxation performance. If the projecting height of each projection 11 is excessively high, and the diameter of the cross section of each projection 11 is excessively small, thermal conductivity drops; consequently, heat radiation performance may drop.

In the case where thermal stress arising in the heat radiator 1 is relatively low, preferably, each of the projections 11 has a projecting height smaller than the diameter of its cross section. More preferably, the projecting height of each projection 11 is 0.5 mm to 0.8 mm, and the diameter of the cross section of each projection 11 is 1.5 mm to 3 mm. If the projecting height of each projection 11 is excessively low, and the diameter of the cross section of each projection 11 is excessively large, at the time of generation of thermal stress in the heat radiator 1 due to a difference in coefficient of thermal expansion between the insulating substrate 3 and the heat sink 5, the deformation of the stress relaxation member 4 becomes insufficient; consequently, the stress relaxation member 4 may fail to sufficiently exhibit stress relaxation performance. If the projecting height of each projection 11 is excessively high, and the diameter of the cross section of each projection 11 is excessively small, thermal conductivity drops; consequently, heat radiation performance may drop.

Preferably, the heat sink 5 assumes a flat, hollow shape in which a plurality of cooling-fluid channels 12 are formed in parallel, and is formed of aluminum, which exhibits excellent thermal conductivity and is light. A cooling fluid may be either liquid or gas.

Brazing of the stress relaxation member 4 and the metal layer 7 of the power module substrate 8 to each other and brazing of the stress relaxation member 4 and the heat sink 5 to each other are performed as follows. The stress relaxation member 4 is formed of a bare material of the above-mentioned pure aluminum. The power module substrate 8, the stress relaxation member 4, and the heat sink 5 are arranged in layers. In this arrangement, a sheetlike aluminum brazing-material of, for example, an Al—Si alloy or an Al—Si—Mg alloy intervenes between the stress relaxation member 4 and the metal layer 7 of the power module substrate 8 and between the stress relaxation member 4 and the heat sink 5. Preferably, the thickness of the sheetlike aluminum brazing-material is about 10 μm to 200 μm. When the thickness is too small, lack of supply of the brazing material arises, potentially causing defective brazing. When the thickness is too large, excess supply of the brazing material arises, potentially causing generation of voids and a drop in thermal conductivity.

Next, the power module substrate 8, the stress relaxation member 4, and the heat sink 5 are restrained together by use of an appropriate jig to thereby apply an appropriate load to bond surfaces. The resultant assembly is heated to 570° C. to 600° C. in a vacuum or an inert gas atmosphere. Thus, brazing of the stress relaxation member 4 and the metal layer 7 of the power module substrate 8 to each other and brazing of the stress relaxation member 4 and the heat sink 5 to each other are performed simultaneously.

The above-mentioned power module is applied to, for example, a vehicle, such as a hybrid car, which uses an electric motor as a part of a drive source, for controlling power to be supplied to the electric motor, according to running conditions of the vehicle. Heat generated from the semiconductor device 2 is conducted to the heat sink 5 via the power module substrate 8 and the stress relaxation member 4 and then radiates into the cooling fluid flowing through the cooling-fluid channels 12.

When heat generated from the semiconductor device 2 is conducted to the heat sink 5, the insulating substrate 3 and the heat sink 5 assumes high temperature and thermally expands. Meanwhile, when generation of heat from the semiconductor device 2 stops, the insulating substrate 3 and the heat sink 5 drop in temperature to room temperature and thermally contract. At the time of the above-mentioned thermal expansion and thermal contraction, due to a difference in coefficient of linear thermal expansion between the insulating substrate 3 and the heat sink 5, thermal stress are generated in the heat radiator in the left-right direction in FIG. 1 and in the front-back direction of paper on which FIG. 1 appears. However, the projections 11 of the stress relaxation member 4 deform in such a manner that the diameter of the cross section of each projection 11 expands and contracts, thereby relaxing the thermal stress and thus preventing cracking in the insulating substrate 3, cracking in a bond zone between the insulating substrate 3 and the stress relaxation member 4, and warpage of the upper surface of the heat sink 5. Therefore, heat radiation performance is maintained over a long term.

In Embodiment 1 described above, the projections 11 of the stress relaxation member 4 each assume the form of a solid, circular column. However, the present invention is not limited thereto. The outline of the cross section of each projection 11 may be changed as appropriate, so long as each projection 11 assumes the form of a solid column. For example, each projection 11 may be prismatic. Preferably, in a space between the metal layer 7 of the power module substrate 8 and the plate-like body 10 of the stress relaxation member 4, gaps between the projections 11 are filled with high-thermal-conduction grease or a thermal-conduction resin. Examples of high-thermal-conduction grease include silicone grease, silver paste, and electrically conductive paste. An example thermal-conduction resin is epoxy resin. In this case, thermal conductivity from the power module substrate 8 to the heat sink 5 is improved, whereby heat radiation performance becomes excellent.

Embodiment 2

The present embodiment is shown in FIGS. 3 and 4.

FIG. 3 shows a portion of a power module which uses a heat radiator of Embodiment 2. FIG. 4 shows a stress relaxation member of the heat radiator of Embodiment 2.

In FIGS. 3 and 4, the stress relaxation member 4 similar in constitution to that of Embodiment 1, and a thermal-conduction plate 16 formed of a high-thermal-conduction material; herein, aluminum, and having a plurality of through-holes 17 allowing the respective projections 11 of the stress relaxation member 4 to extend therethrough are disposed between the power module substrate 8 and the heat sink 5 in a heat radiator 15. In Embodiment 2, the projections 11 of the stress relaxation member 4 are not formed in a staggered arrangement, but are formed in a grid arrangement. The thermal-conduction plate 16 is disposed above the plate-like body 10 of the stress relaxation member 4 in such a manner that the projections 11 extend through the respective through-holes 17, and is brazed to the metal layer 7 of the power module substrate 8. A gap is present between the circumferential surfaces of the projections 11 and the corresponding wall surfaces of the through-holes 17. A gap is also present between the upper surface of the plate-like body 10 of the stress relaxation member 4 and the lower surface of the thermal-conduction plate 16 (see FIG. 3). A gap can be formed between the upper surface of the plate-like body 10 of the stress relaxation member 4 and the lower surface of the thermal-conduction plate 16 as follows: brazing of the stress relaxation member 4 and the thermal-conduction plate 16 to the metal layer 7 and brazing of the stress relaxation member 4 to the heat sink 5 are performed in an inverted posture of FIG. 3. A gap is not necessarily required between the upper surface of the plate-like body 10 of the stress relaxation member 4 and the lower surface of the thermal-conduction plate 16. The thermal-conduction plate 16 and the plate-like body 10 of the stress relaxation member 4 may be brazed together.

Preferably, the thermal-conduction plate 16 is formed of a pure aluminum having a parity of 99% or higher, desirably 99.5% or higher, which exhibits high thermal conductivity, high deformability induced by a drop in strength caused by brazing heat, and excellent wettability in relation to a molten brazing material.

Brazing of the thermal-conduction plate 16 and the metal layer 7 to each other is performed by use of a sheetlike aluminum brazing-material which is used, in Embodiment 1, for brazing the end faces of the projections 11 to the metal layer. In the case where the thermal-conduction plate 16 and the plate-like body 10 are brazed together, this brazing is performed while a sheetlike aluminum brazing-material of, for example, an Al—Si alloy or an Al—Si—Mg alloy having a plurality of through-holes allowing the respective projections 11 to extend therethrough intervenes between the thermal-conduction plate 16 and the plate-like body 10.

Preferably, in the heat radiator 15 of Embodiment 2, the gaps between the circumferential surfaces of the projections 11 and the corresponding wall surfaces of the through-holes 17 and the gap between the upper surface of the plate-like body 10 of the stress relaxation member 4 and the lower surface of the thermal-conduction plate 16 are filled with high-thermal-conduction grease or a thermal-conduction resin as in the case of Embodiment 1.

In the heat radiator 15 of Embodiment 2, the thermal-conduction plate 16 may be formed of an aluminum brazing sheet which is composed of a core formed of a pure aluminum having a purity of 99% or higher, desirably 99.5% or higher, and aluminum brazing-material layers covering respective opposite sides of the core; and the aluminum brazing-material layers of the aluminum brazing sheet may be used for brazing the thermal-conduction plate 16 and the metal layer 7 together. Examples of an aluminum brazing-material of the aluminum brazing sheet include an Al—Si alloy and an Al—Si—Mg alloy. Preferably, the thickness of the aluminum brazing-material layer is about 10 μm to 200 μm. When the thickness is too small, lack of supply of the brazing material arises, potentially causing defective brazing. When the thickness is too large, excess supply of the brazing material arises, potentially causing generation of voids and a drop in thermal conductivity.

Embodiment 3

The present embodiment is shown in FIGS. 5 and 6.

FIG. 5 shows a portion of a power module which uses a heat radiator of Embodiment 3. FIG. 6 shows a stress relaxation member of the heat radiator of Embodiment 3.

In FIGS. 5 and 6, two stress relaxation members 4 similar in constitution to that of Embodiment 1 are disposed between the power module substrate 8 and the heat sink 5 in a heat radiator 20. The upper stress relaxation member 4 is disposed with the projections 11 facing downward, and the lower stress relaxation member 4 is disposed with the projections 11 facing upward. In Embodiment 3, the projections 11 of the two stress relaxation members 4 are not formed in a staggered arrangement, but are formed in a grid arrangement. The upper surface of the plate-like body 10 of the upper stress relaxation member 4 is brazed to the metal layer 7 of the power module substrate 8, and the lower surface of the plate-like body 10 of the lower stress relaxation member 4 is brazed to the heat sink 5. Such brazing is performed by use of a sheetlike aluminum brazing-material. The projections 11 of the two stress relaxation members 4 are formed in such a manner as to not interfere with one another between the two stress relaxation members 4. The end faces of the projections 11 of the upper stress relaxation member 4 are brazed to the upper surface of the plate-like body 10 of the lower stress relaxation member 4, whereas the end faces of the projections 11 of the lower stress relaxation member 4 are brazed to the lower surface of the plate-like body 10 of the upper stress relaxation member 4. Such brazing is performed while a sheetlike aluminum brazing-material of, for example, an Al—Si alloy or an Al—Si—Mg alloy having a plurality of through-holes allowing the respective projections 11 to extend therethrough intervenes between the plate-like bodies 10 and the end faces of the projections 11 of the two stress relaxation members 4.

In the case of the heat radiator 20 of Embodiment 3, preferably, in a space between the upper and lower stress relaxation members 4, gaps between the projections 11 are filled with high-thermal-conduction grease or a thermal-conduction resin as in the case of Embodiment 1.

In Embodiments 1 to 3 described above, the metal layer 7 is formed on the lower surface of the insulating substrate 3 of the power module substrate 8. However, the present invention is not limited thereto. The metal layer is not necessarily required. In the heat radiators 1 and 15 of Embodiments 1 and 3, the stress relaxation member 4 is brazed directly to the insulating substrate 3. In the heat radiator 20 of Embodiment 2, the stress relaxation member 4 and the thermal-conduction plate 16 are brazed directly to the insulating substrate.

FIG. 7 shows a modified stress relaxation member for use in the heat radiators 1, 15, and 20 of Embodiments 1 to 3.

A stress relaxation member 25 shown in FIG. 7 is formed of a high-thermal-conduction material; herein, aluminum, by, for example, press work. The stress relaxation member 25 includes a plate-like body 26 having a plurality of through-holes 27 formed in a staggered arrangement, and hollow, cylindrical projections 28 formed integrally with the plate-like body 26 and standing around the respective through-holes 27.

Preferably, the thickness of the plate-like body 26 is 0.5 mm to 3 mm. If the plate-like body 26 is excessively thin, at the time of generation of thermal stress in the heat radiator 1, 15, or 20 due to a difference in coefficient of thermal expansion between the insulating substrate 3 and the heat sink 5, the deformation of the stress relaxation member 25 becomes insufficient; consequently, the stress relaxation member 25 may fail to sufficiently exhibit stress relaxation performance. If the plate-like body 26 is excessively thick, thermal conductivity drops; consequently, heat radiation performance may drop.

In the case where thermal stress arising in the heat radiator 1, 15, or 20 is relatively high, preferably, each of the projections 28 has a projecting height greater than the diameter of its cross section. More preferably, the projecting height of each projection 28 is in excess of 0.8 mm and not greater than 1.5 mm, and the diameter of the cross section of each projection 28 is 0.8 mm or greater and less than 1.5 mm. If the projecting height of each projection 28 is excessively low, and the diameter of the cross section of each projection 28 is excessively large, at the time of generation of thermal stress in the heat radiator 1, 15, or 20 due to a difference in coefficient of thermal expansion between the insulating substrate 3 and the heat sink 5, the deformation of the stress relaxation member 25 becomes insufficient; consequently, the stress relaxation member 25 may fail to sufficiently exhibit stress relaxation performance. If the projecting height of each projection 28 is excessively high, and the diameter of the cross section of each projection 28 is excessively small, thermal conductivity drops; consequently, heat radiation performance may drop.

In the case where thermal stress arising in the heat radiator 1, 15, or 20 is relatively low, preferably, each of the projections 28 has a projecting height smaller than the diameter of its cross section. More preferably, the projecting height of each projection 28 is 0.5 mm to 0.8 mm, and the diameter of the cross section of each projection 28 is 1.5 mm to 3 mm. If the projecting height of each projection 28 is excessively low, and the diameter of the cross section of each projection 28 is excessively large, at the time of generation of thermal stress in the heat radiator 1, 15, or 20 due to a difference in coefficient of thermal expansion between the insulating substrate 3 and the heat sink 5, the deformation of the stress relaxation member 25 becomes insufficient; consequently, the stress relaxation member 25 may fail to sufficiently exhibit stress relaxation performance. If the projecting height of each projection 28 is excessively high, and the diameter of the cross section of each projection 28 is excessively small, thermal conductivity drops; consequently, heat radiation performance may drop.

Preferably, the stress relaxation member 25 is formed of a pure aluminum having a purity of 99% or higher, desirably 99.5% or higher.

Preferably, in use of the stress relaxation member 25, in addition to filling the gaps with high-thermal-conduction grease or a thermal-conduction resin as mentioned in the description of Embodiments 1 to 3, the interiors of the projections 28 are filled with high-thermal-conduction grease or a thermal-conduction resin.

The stress relaxation member 25 shown in FIG. 7 may be formed of an aluminum brazing sheet which is composed of a core formed of a pure aluminum having a purity of 99% or higher, desirably 99.5% or higher, and aluminum brazing-material layers covering respective opposite sides of the core; and the aluminum brazing-material layers of the aluminum brazing sheet may be used for brazing the stress relaxation member 25. Examples of an aluminum brazing-material of the aluminum brazing sheet include an Al—Si alloy and an Al—Si—Mg alloy. Preferably, the thickness of the aluminum brazing-material layer is about 10 μm to 200 μm. When the thickness is too small, lack of supply of the brazing material arises, potentially causing defective brazing. When the thickness is too large, excess supply of the brazing material arises, potentially causing generation of voids and a drop in thermal conductivity.

FIG. 8 shows a modified stress relaxation member and a modified thermal-conduction plate for use in the heat radiator 15 of Embodiment 2.

In FIG. 8, projections 31 formed on the upper surface of the plate-like body 10 of a stress relaxation member 30 each assume the form of a solid prism, and a thermal-conduction plate 32 has a plurality of rectangular through-holes 33 allowing the respective projections 31 to extend therethrough.

Figure 1:
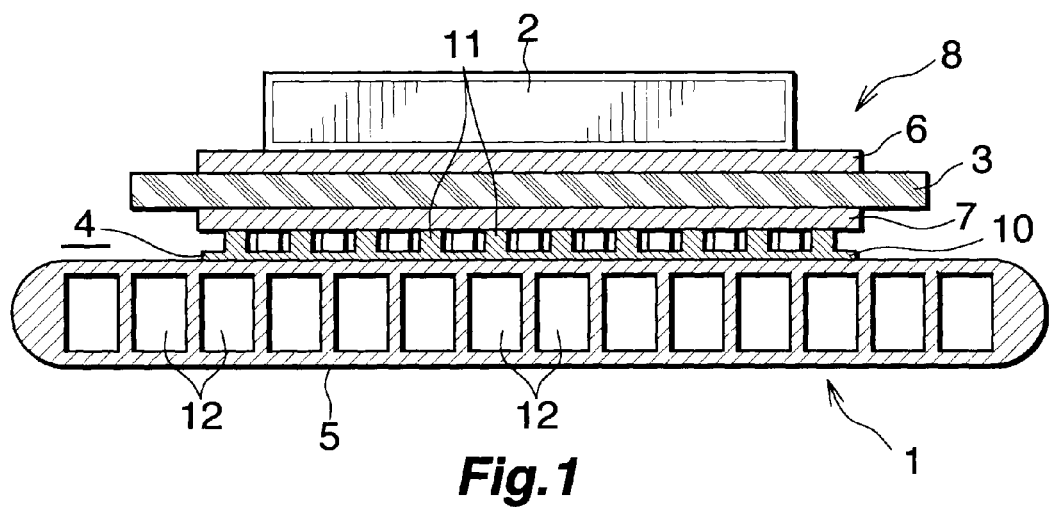
FIG. 1 Vertical sectional view of a portion of a power module which uses a heat radiator, showing Embodiment 1 of a heat radiator according to the present invention.
Figure 2:
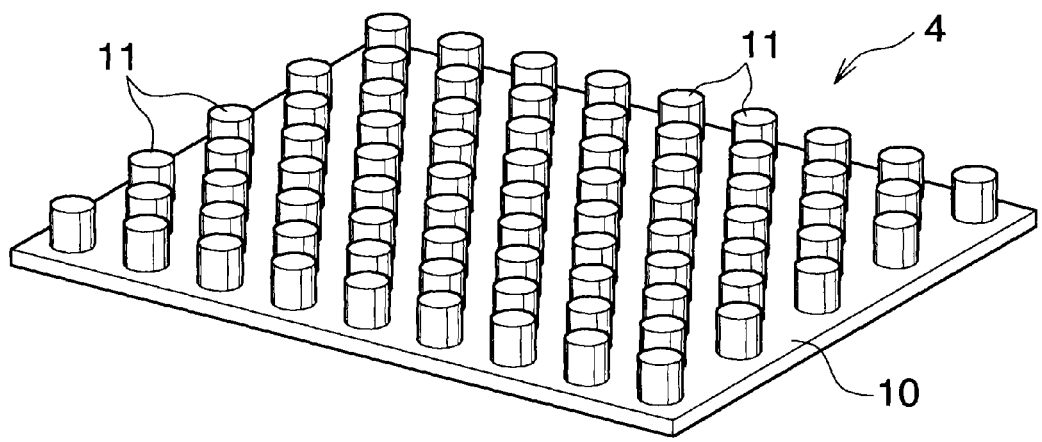
FIG. 2 Perspective view showing a stress relaxation member used in the heat radiator of FIG. 1.
Figure 3:
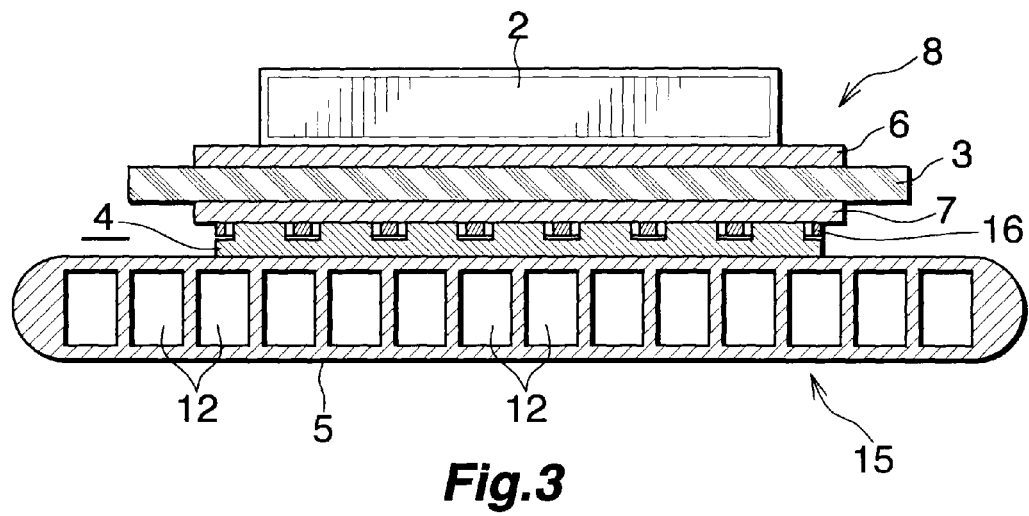
FIG. 3 View equivalent to FIG. 1, showing Embodiment 2 of the heat radiator according to the present invention.
Figure 4:
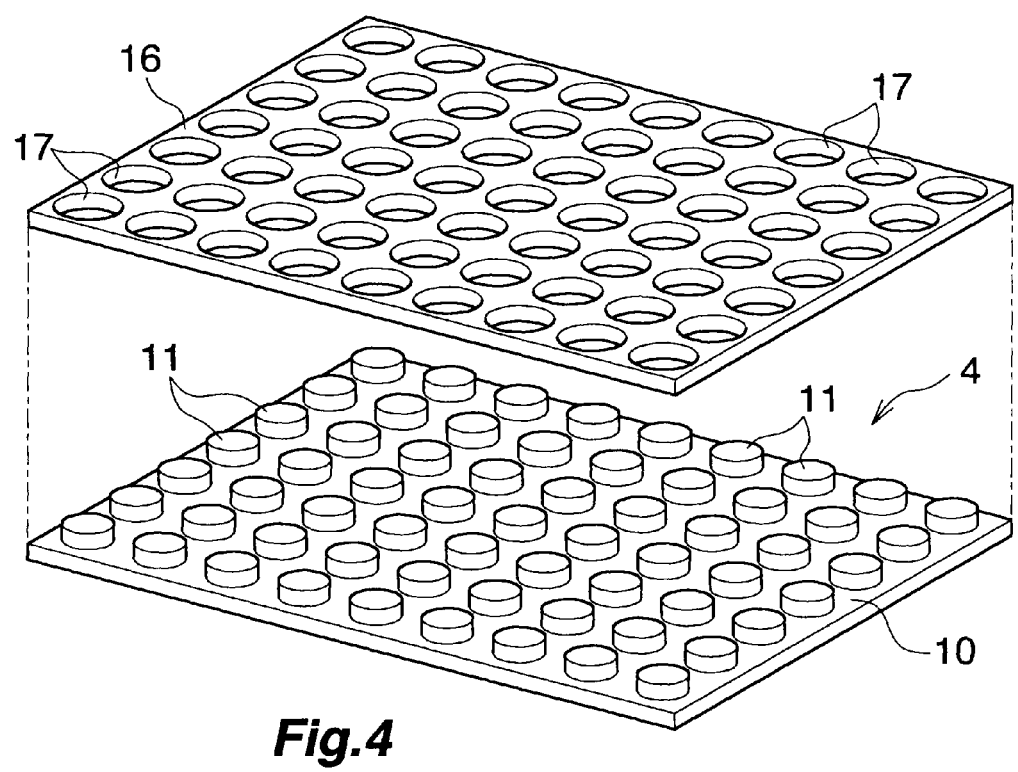
FIG. 4 Perspective view showing a stress relaxation member and a thermal-conduction plate which are used in the heat radiator of FIG. 3.
Figure 5:
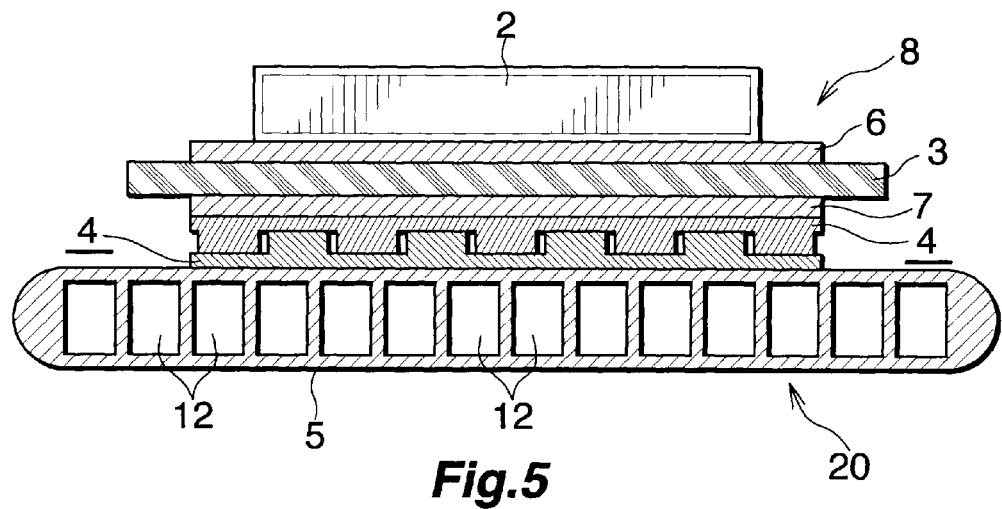
FIG. 5 View equivalent to FIG. 1, showing Embodiment 3 of the heat radiator according to the present invention.
Figure 6:
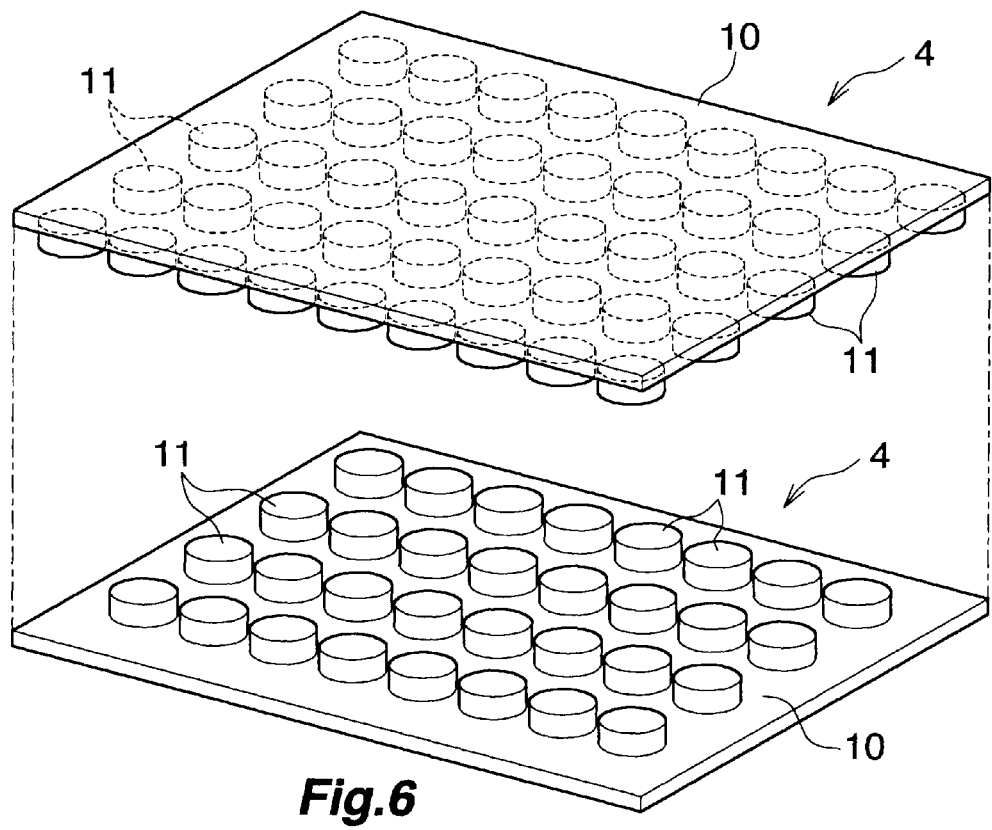
FIG. 6 Perspective view showing a stress relaxation member used in the heat radiator of FIG. 5.
Figure 7:
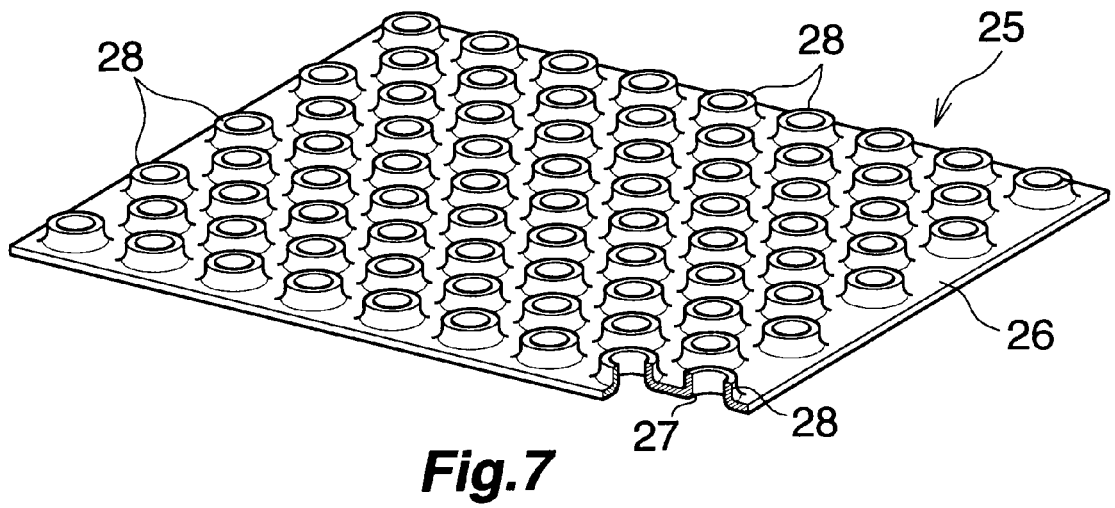
FIG. 7 Partially cutaway perspective view showing a modified stress relaxation member for use in the heat radiators of Embodiments 1 to 3.
Figure 8:
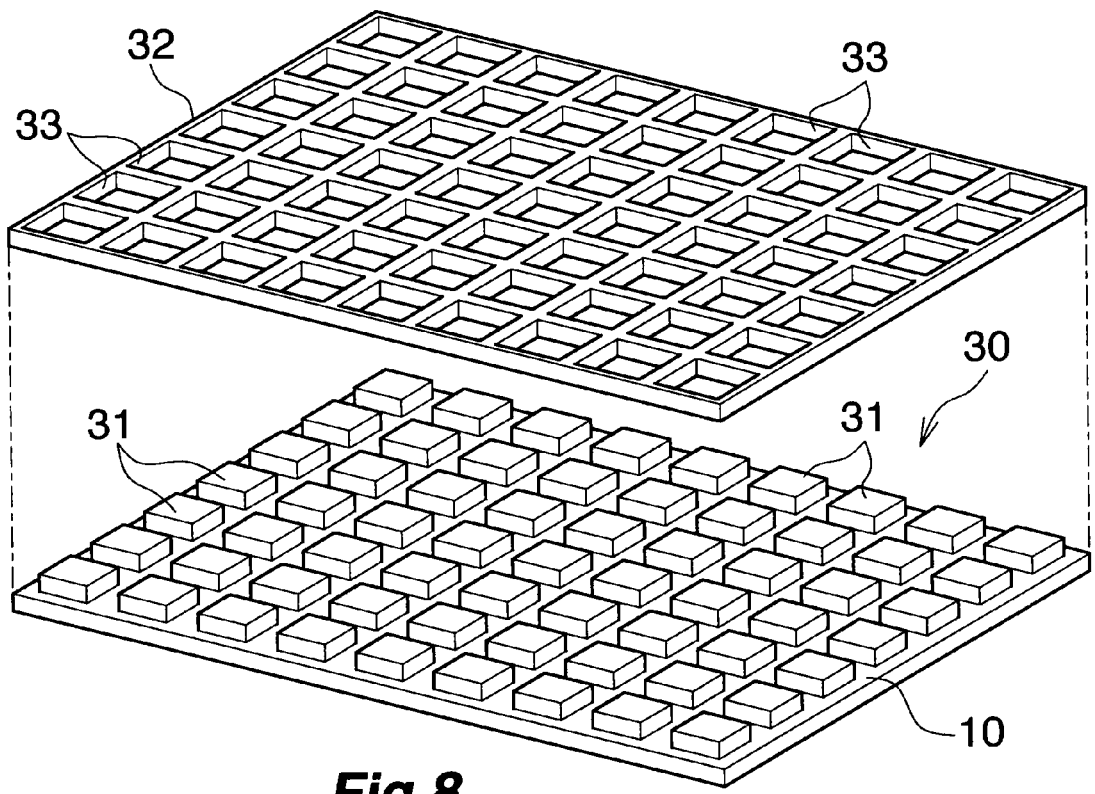
FIG. 8 Perspective view showing a modified stress relaxation member and a modified thermal-conduction plate for use in the heat radiator of Embodiment 2.

The invention claimed is:

1. A heat radiator comprising an insulating substrate having a first side that serves as a heat-generating-element-mounting side, and a heat sink fixed to a second side of the insulating substrate;
   wherein a circuit layer to which a heat-generating-element is bonded is formed on the heat-generating-element-mounting side of the insulating substrate, the heat sink is provided with cooling-fluid flow channels to flow cooling-fluid composed of liquid and a stress relaxation member formed of a high-thermal-conduction material intervenes between the insulating substrate and the heat sink and comprises a plate-like body and a plurality of projections formed at intervals on at least one side of the plate-like body, and the stress relaxation member is metal-bonded to the insulating substrate and to the heat sink.

2. The heat radiator according to claim 1, wherein
   the plurality of projections are formed on only one side of the plate-like body of the stress relaxation member;
   either a side of the plate-like body of the stress relaxation member on which the projections are not formed or end faces of the projections are metal-bonded to the insulating substrate; and
   the side of the plate-like body of the stress relaxation member on which the projections are not formed or the end faces of the projections, whichever are not metal-bonded to the insulating substrate, are metal-bonded to the heat sink.

3. The heat radiator according to claim 2, wherein the plate-like body of the stress relaxation member is metal bonded to the heat sink, and the end surface of the projection is metal bonded to the insulating substrate.

4. The heat radiator according to claim 1, wherein the projections are solid, columnar portions formed integrally with the plate-like body.

5. The heat radiator according to claim 1, wherein the projections are hollow tubular portions formed integrally with the plate-like body around respective through-holes formed in the plate-like body.

6. The heat radiator according to claim 1, wherein each of the projections has a cross section having a circular outline, and a projecting height of each of the projections is greater than a diameter of the cross section.

7. The heat radiator according to claim 6, wherein the diameter of the cross section of each of the projections is 0.8 mm or greater and less than 1.5 mm, and the projecting height is in excess of 0.8 mm and not greater than 1.5 mm.

8. The heat radiator according to claim 1, wherein each of the projections has a cross section having a circular outline, and a projecting height of each of the projections is smaller than a diameter of the cross section.

9. The heat radiator according to claim 8, wherein the diameter of the cross section of each of the projections is 1.5 mm to 3 mm, and the projecting height is 0.5 mm to 0.8 mm.

10. The heat radiator according to claim 1, wherein gaps between the projections of the stress relaxation member are filled with high-thermal-conduction grease or a thermal-conduction resin.

11. The heat radiator according to claim 1, wherein the insulating substrate has a metal layer formed on the second side opposite the heat-generating-element-mounting side, and the stress relaxation member is metal-bonded to the metal layer.

12. The heat radiator according to claim 1, wherein the high-thermal-conduction material is aluminum.

13. The heat radiator according to claim 1, wherein metal-bonding is brazing.

14. A power module comprising a heat radiator according to claim 1, and a semiconductor device mounted on the heat-generating-element-mounting side of the insulating substrate of the heat radiator.

15. A heat radiator according to claim 1, wherein the thickness of the plate-like body of the stress relaxation member is 0.5 to 3 mm, and a projecting height of each projection is in excess of 0.8 mm and not greater than 1.5 mm.

16. A heat radiator according to claim 1, wherein the thickness of the plate-like body of the stress relaxation member is 0.5 to 3 mm, and a projecting height of each projection is 0.5 to 0.8 mm.

17. A heat radiator comprising an insulating substrate having a first side that serves as a heat-generating-element-mounting side, and a heat sink fixed to a second side of the insulating substrate;

wherein a stress relaxation member formed of a high-thermal-conduction material intervenes between the insulating substrate and the heat sink and comprises a plate-like body and a plurality of projections formed at intervals on at least one side of the plate-like body, and the stress relaxation member is metal-bonded to the insulating substrate and to the heat sink;

wherein the plurality of projections are formed on only one side of the plate-like body of the stress relaxation member; either a side of the plate-like body of the stress relaxation member on which the projections are not formed or end faces of the projections are metal-bonded to the insulating substrate; and the side of the plate-like body of the stress relaxation member on which the projections are not formed or the end faces of the projections, whichever are not metal-bonded to the insulating substrate, are metal-bonded to the heat sink; and wherein a thermal-conduction plate formed of a high-thermal-conduction material and having through-holes allowing the respective projections of the stress relaxation member to extend therethrough overlies the side of the plate-like body of the stress relaxation member on which the projections are formed; and the thermal-conduction plate is metal-bonded to the insulating substrate or the heat sink, whichever is metal-bonded to the end faces of the projections.

18. A heat radiator comprising an insulating substrate having a first side that serves as a heat-generating-element-mounting side, and a heat sink fixed to a second side of the insulating substrate;

wherein a stress relaxation member formed of a high-thermal-conduction material intervenes between the insulating substrate and the heat sink and comprises a plate-like body and a plurality of projections formed at intervals on at least one side of the plate-like body, and the stress relaxation member is metal-bonded to the insulating substrate and to the heat sink, wherein two stress relaxation members each having the plurality of projections on only one side of the plate-like body are disposed between the insulating substrate and the heat sink;

a side of the plate-like body of one stress relaxation member on which the projections are not formed is metal-bonded to the insulating substrate;

a side of the plate-like body of the other stress relaxation member on which the projections are not formed is metal-bonded to the heat sink;

the projections of one stress relaxation member are positioned in respective gaps between the projections of the other stress relaxation member; and the end faces of the projections of one stress relaxation member are metal-bonded to the plate-like body of the other stress relaxation member, and vice versa.

19. A heat radiator comprising an insulating substrate having a first side that serves as a heat-generating-element-mounting side, and a heat sink fixed to a second side of the insulating substrate, wherein a circuit layer to which a heat-generating-element is bonded is formed on the heat-generating-element-mounting side of the insulating substrate, a stress relaxation member formed of a high-thermal conduction material intervenes between the insulating substrate and the heat sink and comprises a plate-like body and a plurality of projections formed at intervals on at least one side of the plate-like body, and an end face of the projection of the stress relaxation member is metal-bonded to at least one of the insulating substrate and to the heat sink.

\* \* \* \* \*